(12) United States Patent
Supriya et al.

(10) Patent No.: US 8,592,972 B2
(45) Date of Patent: Nov. 26, 2013

(54) THERMALLY CONDUCTIVE DEVICE WITH A THERMAL INTERFACE MATERIAL

(71) Applicants: Lakshmi Supriya, Chandler, AZ (US); Jessica A Weninger, Chandler, AZ (US); Leonel Arana, Phoenix, AZ (US); Lateef Mustapha, Mesa, AZ (US)

(72) Inventors: Lakshmi Supriya, Chandler, AZ (US); Jessica A Weninger, Chandler, AZ (US); Leonel Arana, Phoenix, AZ (US); Lateef Mustapha, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/754,071

(22) Filed: Jan. 30, 2013

(65) Prior Publication Data

US 2013/0140014 A1 Jun. 6, 2013

Related U.S. Application Data

(62) Division of application No. 12/145,364, filed on Jun. 24, 2008, now Pat. No. 8,383,459.

(51) Int. Cl.
 *H01L 23/34* (2006.01)
(52) U.S. Cl.
 USPC .......................................... 257/712; 257/713

(58) Field of Classification Search
 None
 See application file for complete search history.

(56) References Cited

U.S. PATENT DOCUMENTS

| | | | |
|---|---|---|---|
| 6,197,859 B1 | 3/2001 | Green et al. | |
| 6,451,422 B1 * | 9/2002 | Nguyen | 428/323 |
| 6,616,999 B1 * | 9/2003 | Freuler et al. | 428/40.1 |
| 8,383,459 B2 | 2/2013 | Supriya et al. | |
| 2003/0203181 A1 * | 10/2003 | Ellsworth et al. | 428/307.3 |
| 2005/0150887 A1 * | 7/2005 | Taya et al. | 219/548 |
| 2005/0171269 A1 * | 8/2005 | Hu et al. | 524/495 |
| 2006/0086096 A1 | 4/2006 | Ghoshal | |
| 2006/0234056 A1 | 10/2006 | Huang et al. | |
| 2007/0161729 A1 * | 7/2007 | Chiou et al. | 524/356 |
| 2008/0230893 A1 * | 9/2008 | Too et al. | 257/704 |

* cited by examiner

*Primary Examiner* — Scott B Geyer
(74) *Attorney, Agent, or Firm* — Winkle, PLLC

(57) ABSTRACT

Methods are disclosed to process a thermal interface material to achieve easy pick and placement of the thermal interface material without lowering thermal performance of a completed semiconductor package. One method involves applying a non-adhesive layer on one or more surfaces of the thermal interface material, interfacing the thermal interface material with one or more components to interface the non-adhesive layer therebetween, and applying heat to alter the non-adhesive layer to increase thermal contact between the thermal interface material and the interfacing component(s).

6 Claims, 2 Drawing Sheets

THERMALLY CONDUCTIVE DEVICE WITH A THERMAL INTERFACE MATERIAL

RELATED APPLICATION

The present application is a divisional of U.S. patent application Ser. No. 12/145,364, filed on Jun. 24, 2008, entitled "METHODS OF PROCESSING A THERMAL INTERFACE MATERIAL".

BACKGROUND

1. Technical Field

Embodiments of the invention relate to thermal interface materials and more particularly to methods of processing thermal interface materials to allow easy pick and placement of the thermal interface materials.

2. Description of Related Art

Packaging of a mixed-die multi-chip package may involve one or more types of thermal interface materials (TIMs), e.g. solder TIM and elastomer TIM. To simplify the packaging process and reduce costs, it would be desirable to use a same method to assemble both types of thermal interface materials. One method involves the use of a vacuum nozzle tool to pick a TIM pre-form from a pocketed carrier tape and placing the TIM pre-form on the backside of a semiconductor die. While this method is suitable for solder TIM, problems arise when the same method is applied to elastomeric pad-type TIMs.

Most elastomeric pad-type TIMs are adhesive or tacky on both sides to enhance attachment of the TIM to a mating surface of the semiconductor die and to increase thermal contact between the TIM and the mating surface. This adhesive property, however, hinders pick and place ability of the tool and requires significant modifications to the tool to overcome the adhesive property. Although a non-adhesive/non-tacky coating (e.g. talc film) can be applied instead to the TIM, this is undesirable as the non-adhesive coating contributes to poor thermal contact and thermal performance.

DETAILED DESCRIPTION OF ILLUSTRATIVE EMBODIMENTS

Figure 1:
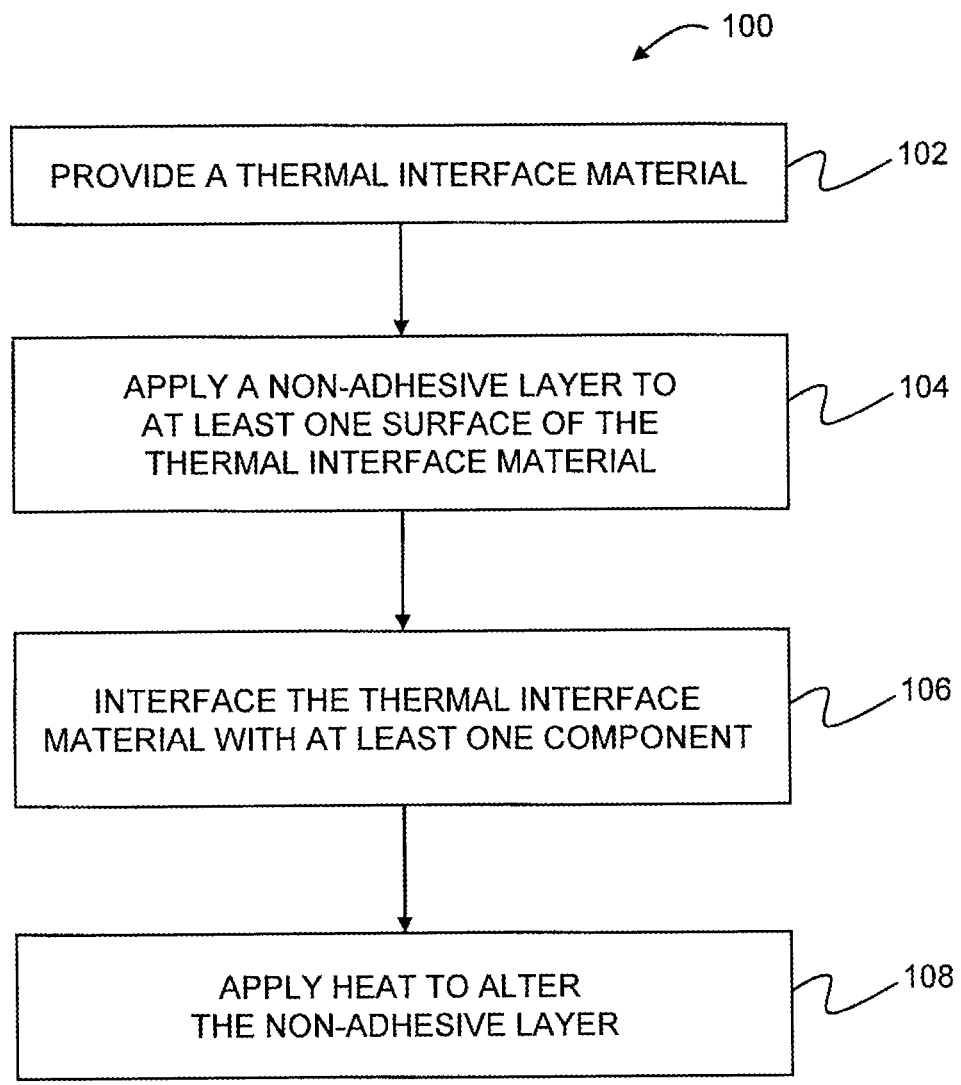
FIG. 1 is a flow sequence for processing a thermal interface material according to one embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. In other instances, well known process operations have not been described in detail in order not to unnecessarily obscure pertinent aspects of embodiments being described. In the drawings, like reference numerals refer to same or similar functionalities or features throughout the several views.

FIG. 1 is a flow sequence for processing a thermal interface material according to one embodiment of the invention. The flow sequence 100 will be described with further reference to FIGS. 2A to 2D illustrating various process outputs obtained during the flow sequence 100 of FIG. 1.

The flow sequence 100 begins with providing a thermal interface material (TIM) 202, e.g. an elastomeric thermally conductive body in pad form (block 102). The thermal interface material 202 may be polymer-based and suitable material examples include, but are not limited to elastomeric silicone, acrylic, and polyurethanes.

A thin layer of a non-adhesive material is applied to at least one surface of the thermal interface material 202 (block 104). While various types of non-adhesive materials may be envisaged for use in embodiments of the invention, suitable materials should provide a sufficiently non-adhesive layer 206 when applied on a thermal interface material to facilitate easy handling (e.g. picking and placement) of the thermal interface materials. The non-adhesive materials should also be alterable upon application of an appropriate stimulus, e.g. heat, so that adhesion and thermal contact between the thermal interface material and a component with which the thermal interface material is to interface may be improved. Examples of suitable materials for forming the non-adhesive layer 206 include, but not limited to, a thermally decomposable material and a phase-change material.

In embodiments where the non-adhesive layer 206 includes a thermally decomposable material, the material may be decomposed or separated into two or more constituents when an appropriate stimulus is applied. The constituents may have low molecular weight and possess sufficient volatility to leave minimal residue on the thermal interface material. If the constituents have low volatility, the constituents may be substantially absorbed or drawn into the bulk of the thermal interface material 202 to expose the surface of the thermal interface material 202 on which the non-adhesive layer 206 is applied.

Examples of a thermally decomposable material include, but are not limited to, small molecule compounds (e.g. fluorosilanes), long chain silanes (e.g. octadecyltrichlorosilane), a disulfide (e.g. 1,7 mercaptoheptane), and low molecular weight polymers (e.g. polystyrene, polyethylene, Polyethylene Terephthalate or PET). The non-adhesive layer 206 may further include a material which melts, vaporizes or sublimates when heated. Examples of materials that vaporize or sublimate when heated include, but are not limited to, naphthalene, camphor, terpenes, polycarbonates, and derivatives thereof. The vaporization or sublimation temperatures of these materials may range between about room temperature to about 200° C.

In embodiments where the non-adhesive layer 206 includes a phase-change material, a compound forming the phase-change material may change from a solid state to a liquid state upon application of heat. Examples of suitable phase-change materials include, but are not limited to, naturally occurring rosins, synthetic rosins composed of an abietic acid, a pimaric acid or other resin acids, hydrated salts (e.g. $Ba(OH)_2.8H_2O$, $Mg(NO_3)_2.6H_2O$, $Na_2SO_4.10H_2O$), encapsulated phase change materials (e.g. paraffin waxes encapsulated in polyethylene, polyesters, or other polymeric shells).

Depending on the material selected for the non-adhesive layer 206, application or deposition methods of the material on a thermal interface material 202 may vary. Examples of application methods include, but are not limited to spin-coating, roller-coating and immersion coating. As and when required, prior surface treatment may be performed to enhance application of the non-adhesive layer 206, e.g. treating with plasma, or a mild acid, treating by abrasion. After applying a non-adhesive layer 206 on at least one surface of the thermal interface material, the non-adhesive layer 206 may be further processed, e.g. drying, in preparation for use.

Figure 2A:
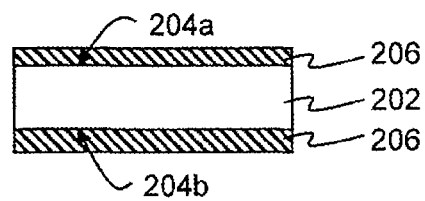
FIGS. 2A to 2D illustrate various process outputs obtained during the flow sequence of FIG. 1.

Reference may be made to FIG. 2A illustrating a thermally conductive device which includes a thermal interface material 202 having a first surface 204a and a second opposed surface 204b, and a non-adhesive layer 206 formed on both the first and the second surfaces (204a, 204b) of the thermal interface material 202. In certain other embodiments, the non-adhesive layer 206 may be formed on only a first surface 204a which is to be manipulated by a tool 208 for picking and placing the thermal interface material 202.

Subsequently, the sequence 100 may then proceed to interface the thermal interface material 202 with at least one component (block 106). The component may be a heat dissipating component 220 (e.g. lid, heat sink, heat spreader), or a heat generating electronic component 210 (e.g. semiconductor die), or both.

Figure 2B:
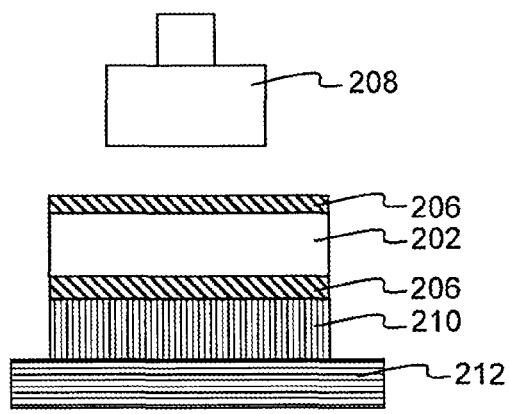

The thermal interface material 202 may be picked and placed on a backside of a semiconductor die 210 by an appropriate tool 208. More particularly, the tool 208 may handle a non-adhesive layer 206 which is applied onto a first surface 204a of the thermal interface materials 202. A second opposed surface 204b of the thermal interface material is accordingly juxtaposed with the backside of the semiconductor die 210. The second opposed surface 204b of the thermal interface material 202 may include a non-adhesive layer 206 applied thereon which is to be interposed between the second opposed surface 204b and the backside of the semiconductor die 210. FIG. 2B illustrates a tool 208 disposing the thermal interface material 202 on a semiconductor device 210 which is mounted on a substrate 212. Alternatively, since the tool 208 may not be required to handle the second opposed surface 204b, the second surface 204b may not include a non-adhesive layer (not shown) or, may include an adhesive material (not shown).

In addition, a heat dissipating component 220 (e.g. lid, heat sink, heat spreader) may be juxtaposed with the non-adhesive layer 206 on the first surface 204a of the thermal interface material 202 to interface with the thermal interface material 202. More particularly, the heat dissipating component may overlay the first surface 204a of the thermal interface material 202.

The sequence 100 then proceeds to apply heat to the non-adhesive layer 206 to alter a property of the non-adhesive layer 206 (block 108). More particularly, an appropriate increase in temperature of the non-adhesive layer 206 would thermally decompose or cause a phase change in the non-adhesive layer 206. With the thermal decomposition or phase-change, thermal contact and thermal transfer between the thermal interface material 202 and the interfacing component(s) 210, 220 may be increased, thereby improving thermal performance of the completed semiconductor package.

Figure 2C:
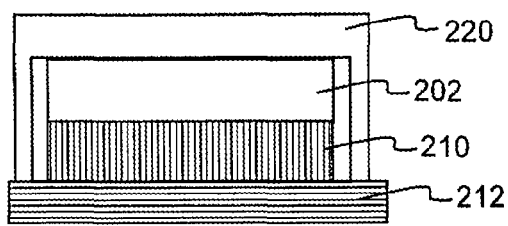

For example, if a thermally decomposable material is used in the non-adhesive layer 206, application of heat at about the thermal decomposition temperature of the non-adhesive layer 206 would decompose the layer 206 into its predetermined constituents. The constituents may be sufficiently volatile to vaporize or sublimate into the environment. If the constituents are not sufficiently volatile, the constituents may be substantially absorbed by the bulk of the thermal interface material 202 to be drawn away from the surface of the thermal interface material 202. In this way, the non-adhesive layer 206 is substantially removed to increase thermal contact between the thermal interface material 202 and the interfacing component(s). FIG. 2C illustrates a semiconductor package in which a thermally decomposable material is used in the non-adhesive layer 206 and is substantially removed from the thermal interface material 202 after decomposition.

Figure 2D:
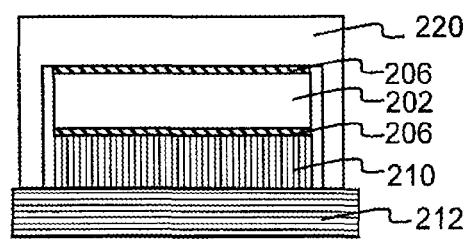

In another example, if a phase-change material is used in the non-adhesive layer 206, application of heat at about the phase-change temperature would melt or alter a state of the material, i.e. from a solid state to a liquid state. The phase-change material in the liquid state has improved adhesion property to increase thermal contact between the thermal interface material 202 and the interfacing component(s) 210, 220. FIG. 2D illustrates a semiconductor package in which a phase-change material is used in the non-adhesive layer 206 and is melted into liquid state which remains on the thermal interface material 202. The phase-change material in liquid state is interposed between the thermal interface material 202 and its interfacing component(s) 210, 220 to increase thermal contact therebetween.

Heat may be applied to the non-adhesive layer 206 during a curing process where a lid placed on the thermal interface material 202 is sealed with a sealant. Alternatively, heat may be applied during solder reflow. In certain embodiments, heat may be applied by providing an appropriate stimulus, e.g. electrical voltage, electromagnetic radiation, to increase a temperature of the non-adhesive layer 206.

For illustration purposes, several examples of suitable non-adhesive materials and their application and processing methods are described as follows. However, it is to be understood that other materials and methods of application and processing are possible.

In one example where the non-adhesive layer 206 includes a fluorosilane compound, e.g. heptadecafluoro 1,1,2,2, tetrahydrodecyl trichlorosilane, the thermal interface material 202 may be plasma treated prior to applying a non-adhesive layer 206 thereon. The thermal interface material 202 is immersed into a solution of the fluorosilane for a few minutes to form the non-adhesive layer 206 having a thickness in the range of nanometers. After drying the thermal interface material 202, it is picked and placed onto a semiconductor die surface. At high temperatures for package heating process or during sealant cure, the non-adhesive layer 206 decomposes into its constituents.

In another example, the non-adhesive layer 206 may include naphthalene or any derivatives thereof which sublimate. The non-adhesive material is spin-coated onto a thermal interface material 202 at a thickness of about 5 nm to 10 nm. Upon application of heat, the naphthalene or its derivative decomposes to leave a surface of the thermal interface material 202 substantially residue-free.

In yet another example, the non-adhesive layer 206 may include rosin. The thermal interface material 202 may be dip-coated in a rosin solution and air-dried at room-temperature. The dry and non-adhesive rosin layer allows easy picking and placement, but is to undergo a phase change at higher temperatures into a liquid form which increases thermal contact between the thermal interface material 202 and its interfacing component(s) 210, 220.

In another example, the non-adhesive layer 206 is a microencapsulated phase change material, e.g. a paraffin wax encapsulated in polymer shells having a size in the range of nanometer to micrometers. The phase change material may be dispersed in a solvent in which a thermal interface material 202 may be dip-coated to apply the phase-change material thereon. The phase change material forms a non-adhesive layer 206 to allow easy picking and placement by a tool, but is to undergo a phase change at higher temperatures into a liquid form which increases thermal contact between the thermal interface material 202 and its interfacing component(s) 210, 220.

Embodiments of the invention achieve easy pick and placement of thermal interface materials and yet provide good adhesive property to maintain good adhesion and thermal contact with interfacing component(s). A non-adhesive layer, which includes a thermally decomposable material or a phase-changeable material, is applied onto a thermal interface material to allow easy pick and placement. The non-adhesive layer may subsequently be processed at appropriate temperatures to alter a property of the layer. In embodiments where a thermally decomposable material is used for the non-adhesive layer, the non-adhesive layer may be decomposed to be substantially removed from the thermal interface material to allow the thermal interface material to interface with an interfacing component, and thereby increasing thermal contact therebetween. In embodiments where a phase-change material is used for the non-adhesive layer, the non-adhesive layer may undergo a phase-change into a liquid form which increases adhesion and thermal contact between the thermal interface material and interfacing component(s).

Other embodiments will be apparent to those skilled in the art from consideration of the specification and practice of the present invention. Furthermore, certain terminology has been used for the purposes of descriptive clarity, and not to limit the invention. The embodiments and features described above should be considered exemplary, with the invention being defined by the appended claims.

What is claimed is:

1. A thermally conductive device comprising:
   a thermal interface material having a first and a second opposed surface;
   a thermally decomposable non-adhesive layer applied on at least the first surface of the thermal interface material, wherein the non-adhesive layer on the first surface is alterable upon application of heat to increase thermal contact between the thermal interface material and a first of a plurality of components with which the thermal interface material is to interface.

2. The device of claim 1, wherein the thermally decomposable non-adhesive layer is further applied on a second opposed surface of the thermal interface material, the thermally decomposable non-adhesive layer on the second surface being alterable upon application of a stimulus to increase thermal contact between the thermal interface material and a second of the plurality of components.

3. The device of claim 2, wherein the plurality of components includes a heat dissipating component and a heat generating electronic component.

4. The device of claim 1, wherein the thermally decomposable non-adhesive layer is selected from the group consisting of a small molecule compound, a long chain silane, a disulfide and a low molecular weight polymer.

5. The device of claim 1, wherein the thermally decomposable non-adhesive layer includes a phase-change material.

6. The device of claim 5, wherein the phase-change material is selected from the group consisting of a naturally occurring rosin, a synthetic rosin, a hydrated salt and an encapsulated phase change material.

* * * * *